US007847538B2

(12) United States Patent
Barker

(10) Patent No.: US 7,847,538 B2

(45) Date of Patent: Dec. 7, 2010

(54) TESTING MICROMIRROR DEVICES

(75) Inventor: Paul Gerald Barker, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/962,909

(22) Filed: Dec. 21, 2007

(65) Prior Publication Data

US 2008/0157801 A1 Jul. 3, 2008

Related U.S. Application Data

(60) Provisional application No. 60/882,751, filed on Dec. 29, 2006.

(51) Int. Cl.
*G01R 31/02* (2006.01)

(52) U.S. Cl. .................................................. 324/158.1

(58) Field of Classification Search ...................... None
See application file for complete search history.

(56) References Cited

U.S. PATENT DOCUMENTS

| | | | | |
|---|---|---|---|---|
| 5,706,123 | A | 1/1998 | Miller et al. | |
| 6,201,521 | B1 | 3/2001 | Doherty | |
| 6,480,177 | B2 | 11/2002 | Doherty et al. | |
| 6,496,028 | B1 * | 12/2002 | Manhaeve et al. | 324/763 |
| 6,788,416 | B2 * | 9/2004 | Reuter | 356/445 |
| 6,889,156 | B2 * | 5/2005 | Pillai | 702/118 |
| 6,937,382 | B2 | 8/2005 | Shih | |
| 6,985,278 | B2 | 1/2006 | Chu et al. | |
| 2004/0042000 | A1 * | 3/2004 | Mehrl et al. | 356/218 |
| 2004/0114206 | A1 * | 6/2004 | Pillai | 359/223 |

* cited by examiner

*Primary Examiner*—Vinh P Nguyen
(74) *Attorney, Agent, or Firm*—Charles A. Brill; Wade James Brady, III; Frederick J. Telecky, Jr.

(57) ABSTRACT

An array of individually addressable micromirrors is characterized by sending a driving signal to a pixel group having a fewer number of micromirrors. A response of the micromirrors in the group is measured; and the micromirror array is characterized based upon at least the measured response.

13 Claims, 3 Drawing Sheets

TESTING MICROMIRROR DEVICES

CROSS REFERENCE TO RELATED APPLICATIONS

This U.S. patent application claims priority from co-pending U.S. provisional patent application Ser. No. 60/882,751 to Barker, filed Dec. 29, 2006, the subject matter being incorporated herein by reference in its entirety.

TECHNICAL FIELD

The technical field of this disclosure is related to the art of micromirror array devices, and more particularly to the art of characterization of micromirror devices using reset drivers.

BACKGROUND

A typical micromirror array device, such as a digital micromirror device (DMD™) by Texas Instruments, Inc. for use in display systems, comprises thousands or millions of individually addressable micromirrors. Each micromirror comprises a number of miniature and delicate components, such as a reflective and deflectable mirror plate, a deformable hinge, one or more addressing electrodes, an electronic circuit, and other suitable components. The miniature components are interconnected in the micromirror array so as to enable operations of the micromirrors and the micromirror array with the desired performance.

Due to the high complexity, miniature sizes, and delicate nature of each micromirror, as well as the intricacy and complexity of their interconnections in the micromirror array, it is often difficult to characterize or test a micromirror array, especially a micromirror array having a large number (e.g. thousands or millions) of individually addressable micromirrors.

Therefore, what is desired is a reliable and robust method for characterizing a micromirror array.

SUMMARY

In one example, a method is disclosed herein. The method comprises: providing a device comprising an array of individually addressable micromirrors with each micromirror comprising a deflectable mirror plate and an addressing electrode; arranging the micromirrors in the device into a set of groups with each group comprising a number micromirrors that are connected to a reset line; selecting a group; and characterizing the micromirrors in said selected group, comprising: applying an electrical signal to the micromirrors through said reset line; measuring a response of the micromirrors to the applied electrical signal; and evaluating the micromirrors in the selected group based upon the measured response.

In another example, a system is provided herein. The system is capable of characterizing an array of individually addressable micromirrors with each micromirror comprising a deflectable mirror plate and an addressing electrode, wherein the micromirrors in the micromirror array are arranged into a set of groups with each group comprising a number micromirrors that are connected to a reset line. The system comprises: means for applying an electrical signal to the micromirrors through a reset line of a selected group; means for measuring a response of the micromirrors to the applied electrical signal; and means for evaluating the micromirrors in the selected group based upon the measured response.

In yet another example, a method is disclosed herein which comprises: providing a device comprising an array of individually addressable micromirrors with each micromirror comprising a deflectable mirror plate and an addressing electrode; applying a first electrical signal to a first group of micromirrors so as to set the micromirrors of the first group into a first state; applying a second electrical signal to a second group of micromirrors so as to set the micromirrors of the second group into a second state that is different from the first state; measuring a response of the micromirrors of the first group to the applied first signal; and evaluating the micromirrors in the first group based upon the measured response.

DETAILED DESCRIPTION OF SELECTED EXAMPLES

Disclosed herein is a method for characterizing micromirror arrays each having an array of individually addressable micromirrors. The micromirrors in the micromirror array are arranged in a set of reset groups. The micromirrors in each reset group are connected to a reset line through which reset signals and driving signals for characterizing can be delivered to the micromirrors in the reset group. The reset lines of substantially all reset groups are connected to a reset driver that is designated for providing control signals, which include, but not limited to, reset signals and characterizing driving signals (hereafter driving signals), for the micromirrors in the micromirror array. With the reset groups, the reset driver, and selected driving signals, properties (e.g. continuity, shorts of electronic connections of the micromirrors to the reset drivers and other component, capacitances of the micromirrors, and other properties) of the individual micromirrors, as well as the entire micromirror array, can be characterized. The characterization results can then be used for performance evaluation, quality assurance, and many other purposes.

The characterization method will be discussed in the following with reference to selected examples. It will be appreciated by those skilled in the art that the following discussion is for demonstration purpose; and should not be interpreted as a limitation. Many other variations are also applicable.

Figure 1:
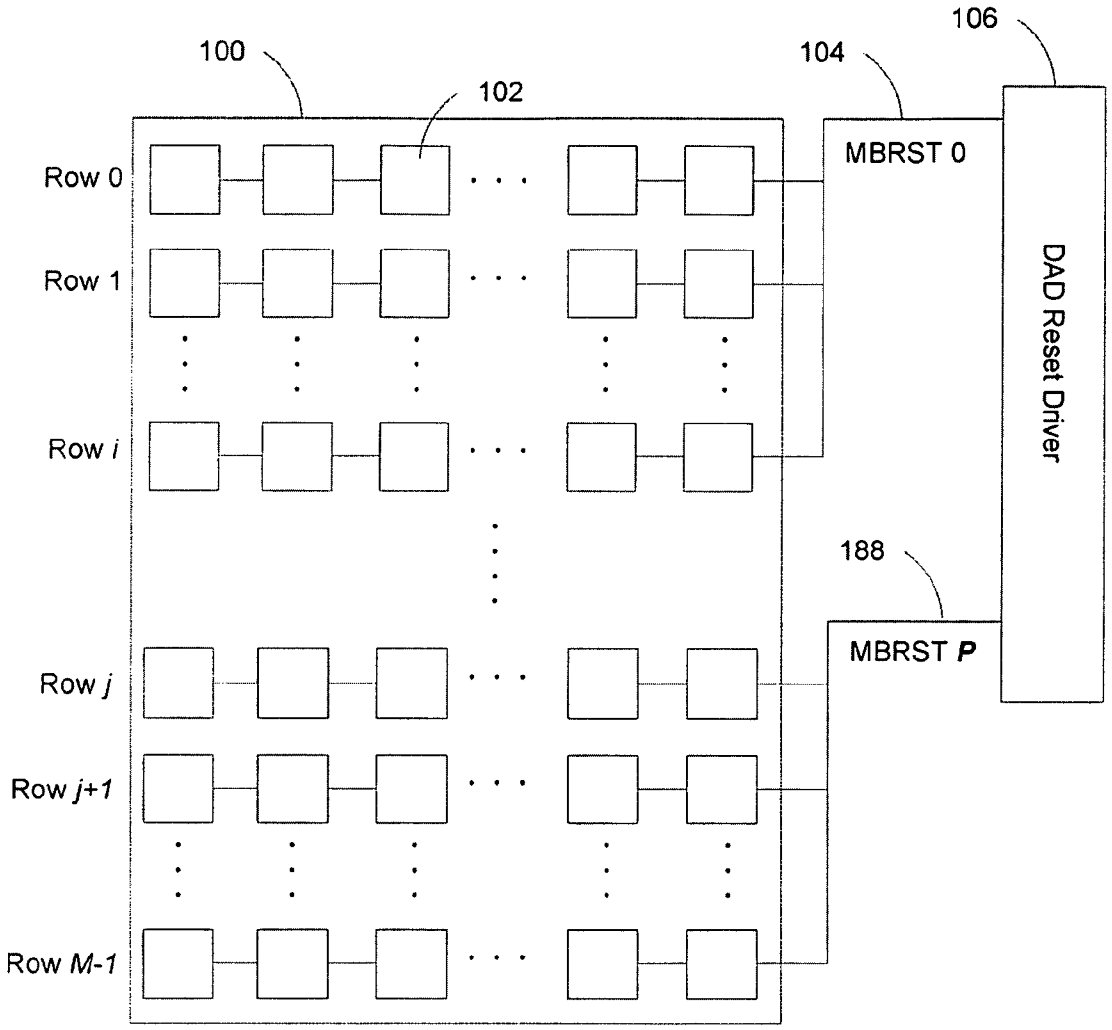
FIG. 1 diagrammatically illustrates an exemplary micromirror array wherein the micromirrors in the array are divided into reset groups that are connected to a reset driver; and wherein the micromirrors of the array are characterized based on the reset groups and using the reset driver.

Referring to the drawings, FIG. 1 schematically illustrates an exemplary micromirror array device. In this example, micromirror array device 100 comprises an array of individually addressable and deflectable micromirrors, such as micromirror 102. The micromirror array comprises M×N micromirrors, with M and N being the numbers of micromirror rows and micromirror columns, respectively. The product value of M×N is often referred to as the native resolution of the micromirror array device, which can be of any suitable values. In one example, the micromirror array device may have a native resolution of 640×480 (VGA) or higher, such as 800×600 (SVGA) or higher, 1024×768 (XGA) or higher, 1280×1024 (SXGA) or higher, 1280×720 or higher, 1400×1050 or higher, 1600×1200 (UXGA) or higher, or even 1920×1080 or higher. Of course, the micromirror array device may have other desired native resolutions. It is noted that FIG. 1 shows only a portion of a micromirror array device; and other components, such as row drivers and column drivers, are not shown in FIG. 1 for simplicity.

The micromirrors of the micromirror array device (100) are divided into multiple groups; and each group is connected to a reset line. A reset line is a line (e.g. an electrical connection line) through which control signals, such as reset signals and driving signals can be delivered to the micromirrors. A reset signal is such a signal that when a micromirror receives the reset signal, the micromirror changes or maintains its operation state based on a preloaded state signal, such as a state signal pre-loaded and stored in a memory connected to the micromirror. The reset lines can be connected to and driven by one or more reset drivers, such as a DAD reset driver (106) by Texas Instruments, Inc. Examples of reset signals, the reset driver, and methods of driving micromirrors using reset signals and the reset driver are set forth in U.S. Pat. No. 6,201,521 to Doherty, issued Mar. 13, 2001; and U.S. Pat. No. 5,969,710 to Doherty issued Oct. 19, 1999, the subject matter of each being incorporated herein by reference in its entirety.

In one example, a group can be formed by a number of micromirror rows in the micromirror array, and different groups comprise substantially the same number of micromirror rows. The micromirror rows in each group are connected to a single reset line. In another example, each group comprises one or more micromirror rows; while different groups may or may not have the same number of micromirror rows. In other examples, the groups may be formed based upon micromirror columns in the micromirror array. Specifically, a group may be formed by a number of micromirror columns; and different groups may or may not have the same number of micromirror columns. The micromirror columns in each group are connected to a single reset line.

In yet another example, the groups may be formed by micromirror blocks with the micromirrors in each block are from different columns and different rows in the micromirror array. Specifically, each group may comprise one or more micromirror blocks; while substantially all micromirrors in the group are connected to a single reset line. Different groups may or may not comprise the same number of micromirror blocks (or the same number of micromirrors).

Regardless of different group designs, the groups can be serially arranged in the micromirror array such that there is substantially no overlap between adjacent groups. In other examples, different groups can be overlapped such that micromirror rows (columns or blocks) from different groups can be interleaved by one or more rows (columns or blocks). In some other examples, a micromirror array can have a number of groups that are formed based on a combination of rows, columns, and/or blocks. For simplicity purpose, the following discussion is based on the assumption that the groups are formed based on micromirror rows; and the groups have substantially the same number of micromirror rows. However, it will be appreciated by those skilled in the art that the following discussion should not be interpreted as a limitation. Many other variations are also applicable.

As shown in FIG. 1, assuming that the micromirror array of device 100 has M rows that are substantially equally divided into M/(i+1) groups with each group comprising (i+1) rows. i is an integer, such as 31, 47, or other desired numbers. The micromirror groups each are connected to one of a set of reset lines MBRST 0 to MBRST P. Specifically, the micromirrors in the group having rows 0 to row i are connected to MBRST 0. The micromirrors in the group having rows j to row M-1 are connected to reset line 188 through which reset signals MBRST P can be delivered. The reset lines are connected to reset driver 106, which can be a DAD reset driver by Texas Instrument, Inc.

Figure 2:
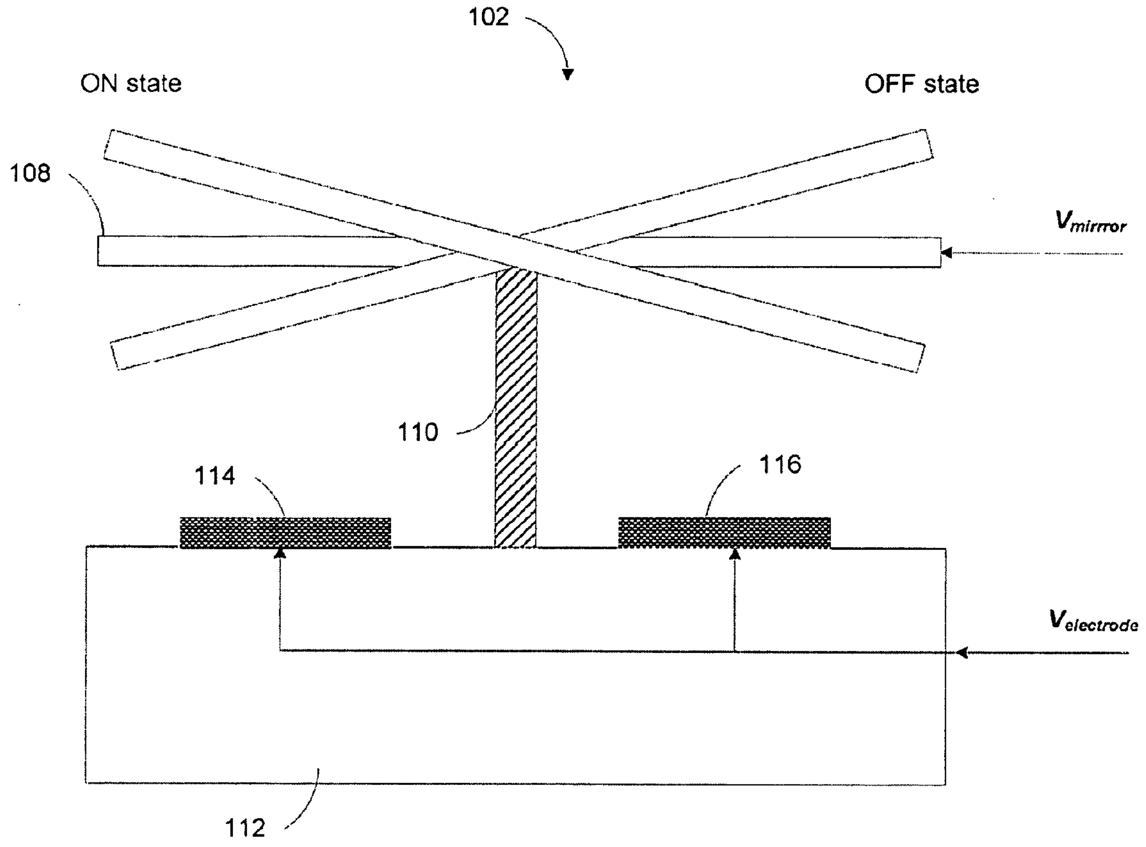
FIG. 2 illustrates a cross-sectional view of an exemplary micromirror of the micromirror array in FIG. 1.

The micromirrors (e.g. micromirror 102) in the micromirror array can be any suitable micromirrors, one of which is schematically illustrated in FIG. 2. Referring to FIG. 2, micromirror 102 comprises reflective and deflectable mirror plate 108 that is held on substrate 112 by post 110. Addressing electrodes 114 and 116 are disposed on substrate 112 and at a location proximate to mirror plate 108 for electrostatically deflecting the mirror plate between the ON and OFF state. Electrical voltages of the addressing electrodes are determined by voltage signal $V_{electrode}$. Electrical voltage of the mirror plate (108) is determined by voltage signal $V_{mirror}$ delivered from a reset line, such as reset line 104 in FIG. 1. In practice, the reset line can be connected to the mirror plate through the post that is electrically connected to the mirror plate—that is, the voltage signals for the mirror plate can be delivered to the mirror plate from the reset line through the post (110).

Characterization of electrical connections of the micromirrors to the reset lines, and capacitances characteristics of the micromirrors in each group can be accomplished using the reset driver and reset lines, preferably without adding extra electrical connections or structures so as to reduce cost and simplifies the characterization procedure. An exemplary characterization method is schematically illustrated in a block diagram in FIG. 3.

Figure 3:
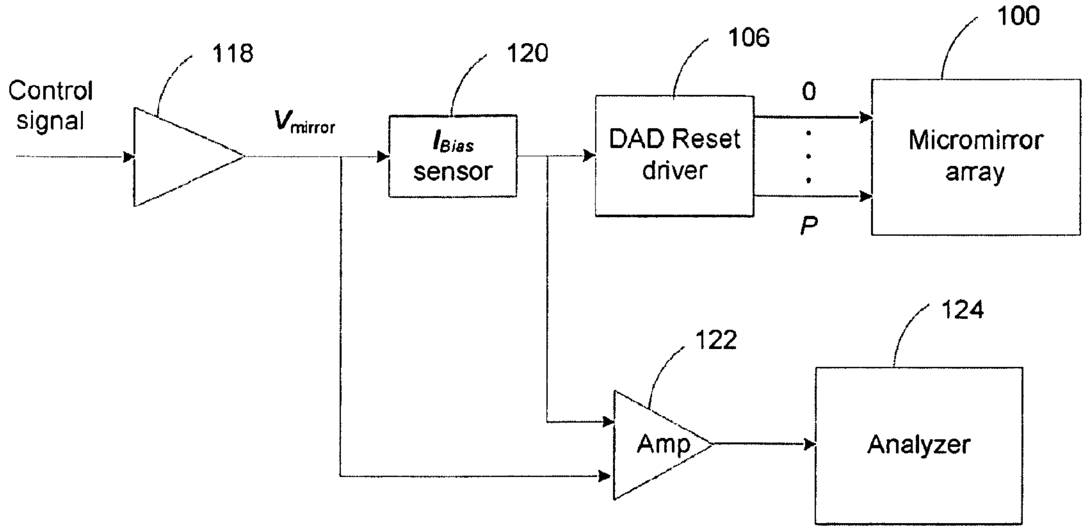
FIG. 3 is a diagram illustrating an exemplary method for characterizing the micromirrors in the micromirror array as illustrated in FIG. 1.

Referring to FIG. 3, micromirror array device 100 is connected to reset driver 106 (e.g. DAD reset driver by Texas Instrument, Inc.) by reset lines 0 through P. The reset driver (106) is connected to programmable voltage supplier 118 that is capable of generating voltage signals $V_{mirror}$ to be applied to the mirror plates of the micromirrors (e.g. micromirror 102 in FIG. 1) in the micromirror array device (e.g. micromirror array device 100 in FIG. 1). Operations of voltage supplier 118 are controlled by an input control signal, which can be generated by other functional modules associated with the micromirror array device. For measuring the current amplitude $I_{Bias}$ of the voltage signals $V_{mirror}$ applied to the mirror plates, sensor 120, such as an electronic resistor, is disposed between voltage signal supplier 118 and reset driver 106 as shown in FIG. 3. The input and output of the sensor (120) are respectively connected to inputs of amplifier 122 that amplifies the input signals (e.g. the input and output signals from sensor 120), preferably with substantially same amplification factor. The amplifier (122) can be important especially when the input and output signals from sensor 120 have small amplitudes; or when the difference between the input and output signals from sensor 120 too small to be accurately measured. The amplified voltage signals output from the amplifier (122) are delivered to analyzer 124 for being analyzed.

Figure 4:
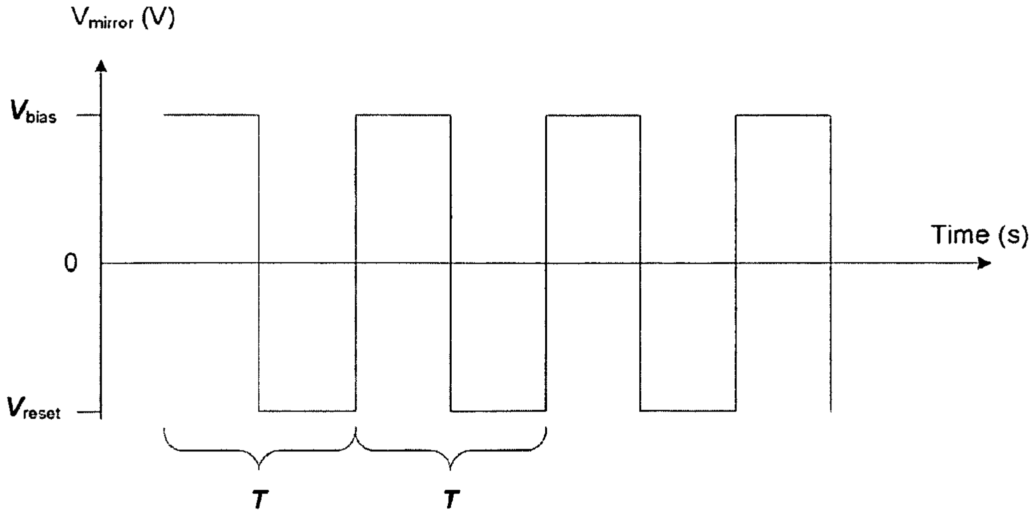
FIG. 4 schematically illustrates an exemplary sequence of driving signals delivered to the micromirrors of the micromirror array in FIG. 1 for characterizing the micromirrors and the micromirror array.

For characterizing the micromirrors, mirror plate voltage signals $V_{mirror}$ may have any suitable profiles. In one example, the mirror plate voltage signal $V_{mirror}$ comprises a sequence of square voltages, as shown in FIG. 4. Referring to FIG. 4, mirror plate voltage $V_{mirror}$ vs. time is illustrated therein. The square voltages each have a period T, a positive maximum value $V_{bias}$, and a negative maximum $V_{reset}$. In this particular example, substantially no intermediate voltage states exist in the transition between the positive and negative maximum values of $V_{bias}$ and $V_{reset}$. In other words, the positive maximum value $V_{bias}$ is connected to the negative maximum value $V_{reset}$ by substantially a straight line; and the straight line may have any suitable angles to the vertical axis, and more preferably, is substantially parallel to the vertical axis.

$V_{bias}$ and $V_{reset}$ each can be any suitable values or any suitable combinations of values, as those set forth in U.S. Pat. No. 6,201,521 to Doherty, issued Mar. 13, 2001; and U.S. Pat. No. 5,969,710 to Doherty issued Oct. 19, 1999, the subject matter of each being incorporated herein by reference in its entirety. In one example, $V_{bias}$ can be from 20 to 30 volts, such as 16 volts; and $V_{reset}$ can be from −20 volts to −30 volts. The voltage sequence may have a frequency preferably equal to or greater than 1 MHZ. However, it is preferred, though not required that the voltage sequence is not equal to the resonant frequency of the micromirrors in the micromirror array, the average resonance frequency of the micromirrors in the array, the average resonant frequency of the micromirrors in each group, or the effective resonant frequency of the micromirror array. An effective resonant frequency of the micromirror array is the resonant frequency such that a voltage signal (or a current signal) with the effective resonant frequency causes substantially all micromirrors in the micromirror array to perform resonant movements.

The squared voltage sequence $V_{mirror}$ can be applied to the micromirrors in many ways. As an example, $V_{mirror}$ can be delivered, through a reset line (e.g. reset line 104 in FIG. 1), to the micromirrors connecting to the reset line; while all other reset lines (also the micromirrors connected to the reset lines) are held at $V_{offset}$. $V_{offset}$ is a voltage at which the mirror plates are expected to be switched (or reset) from one state to the other, such as from the ON state to the OFF state. In one example, $V_{offset}$ is a positive voltage less than $V_{bias}$, such as from 5 volts to 10 volts, and more preferably around 7 volts. The current $I_{bias}$ is measured through sensor 120 and amplifier 122, and analyzed by analyzer 124, which will be discussed in the following.

It is noted with reference to FIG. 2 that the mirror plate and addressing electrodes of the micromirror can be modeled as a capacitor. With the application of alternating driving voltage signals as shown in FIG. 4, the micromirrors in a group (e.g. groups as discussed above with reference to FIG. 1) can exhibit an averaged capacitance. The capacitance of the micromirrors in the group causes the voltage signal $V_{mirror}$ to increase from its static value $I_o$, such as a value measured from the empty socket bias current. By comparing the obtained dynamic current values $I_{bias}$ to the static current value $I_o$, which can be accomplished by analyzer 124 illustrated in FIG. 3, integrity (e.g. continuity, electrical shorts, and/or capacitance) of the reset line(s) connected to the micromirrors can be determined.

For example wherein a group connected to a reset line is to be tested, dynamic values of $I_{bias}$ and static values of $I_o$ can be measured for the micromirrors in the group through the reset line. If the measured dynamic value $I_{bias}$ is lower than $I_o$, or if the difference between $I_{bias}$ and $I_o$ is lower than a pre-determined threshold, it can be determined that an electrical open exists in the reset line. If the measured dynamic value $I_{bias}$ is higher than $I_o$, or if the difference between $I_{bias}$ and $I_o$ is higher than a threshold, it can be determined that an electrical short exists in the reset line.

The integrity of the micromirrors in the group and the reset line connected to the micromirrors of the group can alternatively be measured through investigation of the capacitance of the micromirrors in the group. In one example, a capacitance $C_{mirror}$ can be derived from the measured current $I_{bias}$. This derived capacitance represents the collective alternating-current (AC) response of the micromirrors in the group. The threshold capacitance $C_o$ can be determined from a calibration of an ideal sample (e.g. a micromirror array having desired electronic properties and behaviors). By comparing the derived capacitance $C_{mirror}$ to a threshold value $C_o$, the integrity (continuity, electrical shorts, and other properties) of the micromirrors in the group, as well as the reset line connected to the micromirrors in the group, can be determined. After characterizing micromirrors in one group, micromirrors in another groups can be characterized in a way as discussed above.

The above described characterization method can be implemented in a standalone software module as a sequence of computer executable instructions stored in a computer-readable medium. Alternatively, the above described method can be implemented in an electronic device, such as a field-programmable-gate-array device or an application-specific-integrated-circuit.

The characterization results can then be used for performance evaluation, quality assurance, and many other purposes of the micromirror array devices. In one example, if it is determined that a characterized result (e.g. the integrity of the micromirrors in the micromirror array) does not satisfy a predefined criterion, the micromirror array device can be marked as a "bad device" needing further investigation, analyses, reparation, or being discarded.

It will be appreciated by those of skill in the art that a new and useful method for characterizing integrity of micromirrors of a micromirror array device using reset drivers have been described herein. In view of the many possible examples, however, it should be recognized that the embodiments described herein with respect to the drawing figures are meant to be illustrative only and should not be taken as limiting the scope of what is claimed. Those of skill in the art will recognize that the illustrated embodiments can be modified in arrangement and detail. Therefore, the devices and methods as described herein contemplate all such embodiments as may come within the scope of the following claims and equivalents thereof.

I claim:

1. A method comprising:

providing a device comprising an array of individually addressable micromirrors with each micromirror connected to a common reset line;

applying an alternating voltage signal to said reset line;

measuring an alternating current signal on said reset line as a result of said alternating voltage signal; and comparing said measured current to a predetermined value to determine the integrity of the micromirrors connected to the common reset line.

2. The method of claim 1, wherein each micromirror a deflectable mirror plate and wherein the alternating voltage signal is applied to the mirror plates of the micromirrors through the reset line.

3. The method of claim 1, wherein the step of applying an alternating voltage signal to the micromirrors through said reset line further comprises:

generating said alternating voltage signal by a signal generator; and delivering said alternating voltage signal to a reset driver that is connected to the micromirror array through said reset line.

4. The method of claim 3, further comprising:

passing said alternating voltage signal through a sensor; and measuring the response based upon an output signal of the sensor.

5. The method of claim 4, further comprising:

analyzing the input and output signals of the sensor using a signal analyzer.

6. The method of claim 5, further comprising:

passing the input and output signals to an amplifier; and delivering an output of the amplifier to the analyzer.

7. The method of claim 1, wherein the alternating voltage signal comprises a voltage pulse with a substantially square waveform.

8. The method of claim 7, wherein the square voltage wave comprises a positive maximum value of $V_{bias}$ and a negative maximum value of $V_{reset}$, wherein the positive and negative maximum values are connected by a straight line.

9. The method of claim 7, wherein the square voltage wave comprises a positive maximum value of $V_{bias}$ is from +20 volts to +30 volts.

10. The method of claim 7, wherein the square voltage wave comprises a negative maximum value of $V_{reset}$ is from −20 volts to −30 volts.

11. The method of claim 10, wherein an offset voltage $V_{offset}$ is applied to the micromirrors not connected to said common reset line, the offset voltage causing a deflectable mirror plate associated with each micromirror not connected to said common reset line to be are set to an OFF state or an ON state.

12. The method of claim 11, wherein the offset voltage $V_{offset}$ is greater than 0 and less than $V_{bias}$.

13. A system capable of characterizing an array of individually addressable micromirrors with each micromirror comprising a deflectable mirror plate and an addressing electrode, wherein the micromirrors in the micromirror array are arranged in at least one group of micromirrors connected to a common reset line, the system comprising:

a driver capable of driving an electrical signal to a common reset line;

a sensor capable of measuring a characteristic of the electrical signal; and an analyzer capable of evaluating the group of micromirrors based upon the measured characteristic.

* * * * *